United States Patent [19]

Bosselaers

[11] 4,247,898

[45] Jan. 27, 1981

[54] APPARATUS FOR COMPUTING THE CHANGE IN BEARING OF AN OBJECT

[75] Inventor: Robert J. Bosselaers, Winchester, Mass.

[73] Assignee: RCA Corporation, New York, N.Y.

[21] Appl. No.: 946,214

[22] Filed: Sep. 27, 1978

[51] Int. Cl.³ .............................................. G01R 25/00
[52] U.S. Cl. .................................. 364/460; 324/83 R; 324/83 D; 235/92 PS
[58] Field of Search ...................... 364/449, 460, 424; 235/92 PS; 324/83 R, 83 D; 73/178 R; 343/12 R, 113 R

[56] References Cited

U.S. PATENT DOCUMENTS

| | | | |
|---|---|---|---|
| 3,683,345 | 8/1972 | Faulkes et al. | 235/92 PS |
| 3,706,931 | 12/1972 | Subramanian | 324/83 R |
| 3,854,133 | 12/1974 | Cabion | 343/12 R |
| 3,882,501 | 5/1975 | Botzum et al. | 364/460 |
| 3,980,948 | 9/1976 | Olive | 324/83 R |
| 4,070,618 | 1/1978 | Thomas | 324/83 D |
| 4,112,365 | 9/1978 | Larson et al. | 324/83 R |
| 4,130,793 | 12/1978 | Bridges et al. | 324/83 D |

Primary Examiner—Charles E. Atkinson
Assistant Examiner—Gary Chin
Attorney, Agent, or Firm—Samuel Cohen; Carl V. Olson

[57] ABSTRACT

Apparatus is described for computing the change in bearing of an object during a time period T from continuously-received signals $E_x$ and $E_y$ having amplitudes proportional to x and y components of the bearing of the object. A switch is operated under control of a two-phase clock to connect the signals $E_x$ and $E_y$ in respective phases to a summer. The output of the summer is filtered to derive a sine wave, which is then translated to a square wave. The phase difference between the square wave and an output of the clock is a measure of the bearing of the object. Means to determine the change in phase of the square wave during the time period T provides a measure of the change in bearing of the object.

3 Claims, 3 Drawing Figures

APPARATUS FOR COMPUTING THE CHANGE IN BEARING OF AN OBJECT

The Government has rights in this invention pursuant to Contract No. DAAB07-77-C-3298 awarded by the Department of the Army.

The invention relates to apparatus for computing the change in bearing (direction) of an object, during a given time interval, from signals $E_x$ and $E_y$ having amplitudes proportional to x and y components, respectively, of the bearing of the object. The signals $E_x$ and $E_y$ may be derived from a magnetometer sensitive to disturbances, caused by the object, in the earth's magnetic field.

According to an example of the invention, samples of the signals $E_x$ and $E_y$ at different phases are summed, filtered to produce a sine wave, and the sum is then translated to a square wave. The change in phase of the square wave over a period of time is a measure of the change in bearing of the object.

Figure 1:
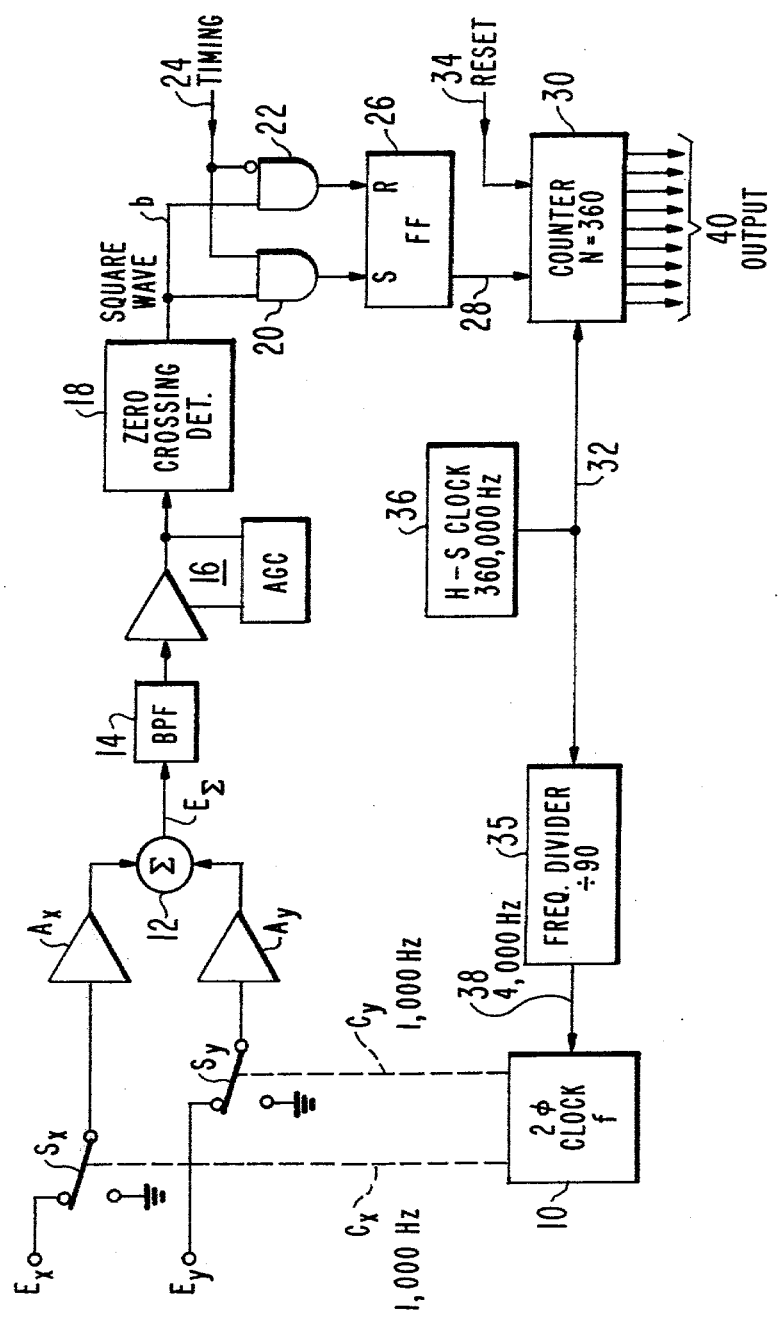
FIG. 1 is a schematic diagram of apparatus constructed according to the teachings of the invention for computing the change in bearing of an object.

Referring now in greater detail to FIG. 1 of the drawing, an electric switch means includes a single-pole, double-throw switch $S_x$ by which the input of an amplifier $A_x$ is connected to a source of a received signal $E_x$ or to ground. The switch means also includes a single-pole, double-throw switch $S_y$ by which the input of an amplifier $A_y$ is connected to a source of a received signal $E_y$ or to ground. The switches $S_x$ and $S_y$ are operated by two respective outputs $C_x$ and $C_y$ of a two-phase clock 10 operating at a frequency f which may be 1000 Hz. The clock outputs $C_x$ and $C_y$ are displaced 90 degrees in phase (have orthogonal phases). Switch $S_x$ is operated so that a square wave having 0 volts and $E_x$ volts is applied to the input of amplifier $A_x$. Similarly, switch $S_y$ is operated so that a square wave having 0 volts and $E_y$ volts is applied to the input of amplifier $A_y$. The two square waves are displaced 90 degrees in phase as illustrated by the phases of waveforms a and c of FIG. 2.

The two-phase clock may be a dual J-K flip-flop Type CD4027 appropriately interconnected to give two orthogonal outputs, and the switches $S_x$ and $S_y$ may be solid state switches included in a Type CD4016 integrated circuit unit manufactured by RCA Corporation.

The square waves from amplifiers $A_x$ and $A_y$ are summed in a summer 12 which may be a resistor network, and the output thereof is applied through a band pass filter 14 to pass the fundamental sine wave frequency of summed waveforms, which is 1000 Hz in the present example. The sine wave output of the filter 14 is applied through an automatic gain controlled amplifier 16 to a zero crossing detector 18 which may simply be a limiting amplifier by which the sine wave input is translated to a square wave output. The square wave is applied to inputs of "and" gates 20 and 22 which are enabled by a timing signal applied over line 24 from a source not shown and having a duration T, as shown by waveform c of FIG. 3.

The output of "and" gate 20 is connected to the set input S of a flip-flop 26, and the output of "and" gate 22 is connected to the reset input R of the flip-flop. The construction is such that the flip-flop is set by the leading edge of the first square wave pulse following the leading edge of the timing pulse, and the flip-flop is reset by the leading edge of the first square wave pulse following the trailing edge of the timing pulse. During the time that the flip-flop is set, and output thereof at 28 enables a ring counter 30 to count pulses applied thereto over line 32 from a high-speed clock 36. The counter 30 is reset over a line 34, slightly before the beginning of the timing pulse signal on line 24, from a source, not shown.

The high-speed clock 36 also supplies an output through a frequency divider 35 to control the frequency of the two-phase clock 10. In the present example, the high-speed clock has an output frequency of 360,000 Hz, the frequency divider 35 divides the clock frequency by 90 to produce an output frequency of 4,000 Hz, which in turn controls the two-phase clock 10 to provide outputs $C_x$ and $C_y$ at 1000 Hz each. (There is an inherent division by four in the control of the two-phase clock by the output of the divider 35).

The ring counter 30 is constructed repeatedly to count to a number N, and the frequency divider 35 is constructed to divide by a number such that the ratio of the frequency (360,000 Hz) of the high speed clock 36 to the frequency (1,000 Hz) of the two-phase clock 10 is also equal to N. If N is made equal to 360 as shown, the output count at 40 on nine leads from the counter 30 is the binary electrical equivalent of a number from 0 to 360, and, at the end of a cycle of operation of the system, is a number representing the change in bearing of an object in degrees over a time period T.

In the operation of the system, voltages are received at terminals $E_x$ and $E_y$ with amplitudes proportional to the x and y components of the bearing of an object. The two outputs $C_x$ and $C_y$ of clock 10 operate the two switches $S_x$ and $S_y$, respectively, in 90-degree phase displaced fashion. The sum of the waveform at the output of the summer 12 is filtered at 14 to a sine wave, and is translated at 18 to a square wave.

Figure 2:
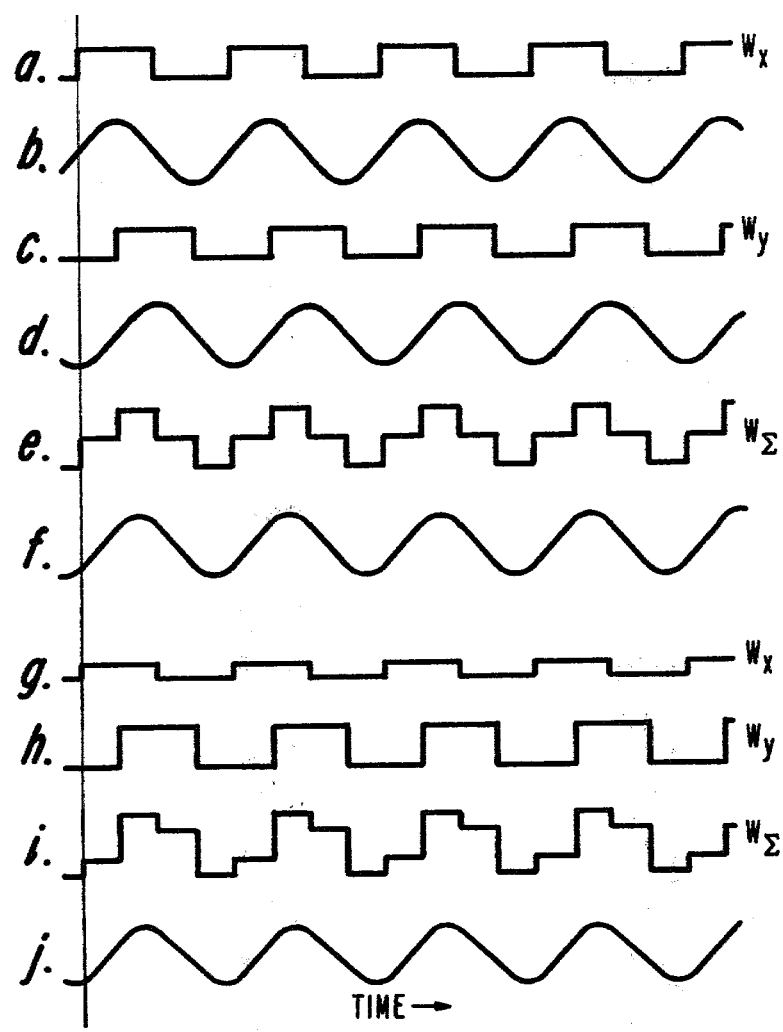
FIG. 2 is a chart of voltage waveforms which will be referred to in describing the operation of a portion of the apparatus of FIG. 1.

FIG. 2 shows waveforms in the system under different conditions. The waveform $W_x$ at the output of switch $S_x$ may be as shown by waveform a of FIG. 2. If the amplitude of signal $E_y$ is zero, the output of summer 12 will also be as shown by a, and the output of the filter 14 will be as shown by waveform b.

To cite another example, if waveform $W_y$ is as shown by waveform c, and voltage $E_x$ is zero, then the outputs of summer 12 and filter 14 will be as shown by waveforms c and d of FIG. 2. It will be noted that waveforms b and d are 90-degree phase displaced.

If $E_x$ and $E_y$ are of equal amplitudes as shown by waveforms a and c, the output of summer 12 is according to e, and the output of filter 14 is according to f. It will be noted that waveform f has a phase 45° from the phase of waveform b and 45 degrees from the phase of waveform d. Under this condition, the object is at a bearing of 45 degrees, where the x axis is zero degrees, and the y axis is 90 degrees.

In a final example where $E_y$ has an amplitude three times as large as the amplitude of $E_x$, the waveforms g and h have the waveform i when summed, and the waveform j after filtering. Because of the differences in the amplitudes of $E_x$ and $E_y$, the phase of the sine wave j indicates a bearing of the object at an angle between 45 and 90 degrees. It is thus apparent that the phase of the sine wave at the output of the filter 14 indicates the angular bearing of an object relative to x and y coordinates.

Figure 3:
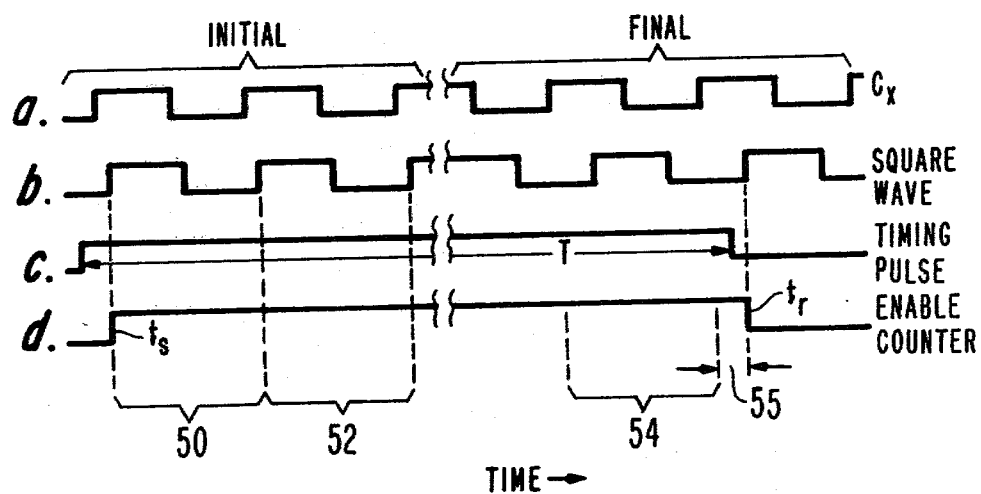
FIG. 3 is a chart of voltage waveforms which will be referred to in describing another position of the apparatus of FIG. 1.

The sine wave is amplified to a uniform value at 16 and is translated to a square wave at 18 for the purpose of providing a digital indication of the change in the phase of the sine wave, and the corresponding change in the angular bearing of the object, over a period of time T represented by the timing waveform c of FIG. 3. The waveform a at the output $C_x$ of clock 10 has an unchanging reference phase. The square wave waveform b in FIG. 3 at the output of zero crossing detector 18 has an initial phase displacement relative to the clock waveform a, and a different final phase displacement at the end of the time period T.

The flip-flop 26 is set at time $t_s$ of the first leading edge of square wave b which follows the leading edge of the timing pulse c in FIG. 3. The flip-flop is reset at the time $t_r$ of the first leading edge of the square waveform b following the trailing edge of the timing pulse c. The waveform d represents the time period during which the flip-flop 26 enables the counter 30 over the enable line 28 to count the pulses from the high-speed clock 36. During each cycle of a square wave from clock 10 (and the square wave b) there are 360 pulses from the high-speed clock 36. The counter 30 counts the 360 pulses during the period 50 in FIG. 3 before starting again at zero and counting 360 pulses during the period 52. Later, 360 pulses are counted during the period 54. Then, the counter continues to be enabled and to count during the period 55 until the counter is disabled from counting at the time $t_r$.

The count in the counter at time $t_r$ represents the change in bearing or angle of the object during the period from time $t_s$ to time $t_r$, and, to a close approximation, during the time interval T of the timing pulse c in FIG. 3. In the example shown graphically in FIG. 3, the change-in-bearing count from counter 30 is 1/5th of 360, or 72. This count present on the nine output leads 40 of the counter 30 represents a change in bearing angle of the object of 72 degrees during the time period T. It is thus apparent that following the end of every timing pulse, the count at the output 40 of the counter 30 is a number representing the change in bearing of the object during the time period T of the timing pulse.

What is claimed is:

1. Means to compute the change in bearing of an object during a time period T from continuously-received signals $E_x$ and $E_y$ having amplitudes proportional to x and y components of the bearing of the object, comprising
   a two-phase clock,
   a summer,
   switch means operated under control of the two outputs in different phases of said clock to apply said signals $E_x$ and $E_y$ in respective phases to said summer,
   a filter to derive a sine wave from the output of said summer,
   means to translate the sine wave from said filter to a square wave, whereby the phase difference between said square wave and an output of said clock is a measure of the bearing of the object, and
   means to determine the change in phase of said square wave during said time period T to provide a measure of the change in bearing of the object, said means to determine the change in phase of said square wave including a counter operated for an integral number of cycles of said square wave during the time period T, and said means to determine the change in phase of said square wave including a high-speed clock having an output coupled to the input of said counter, and coupled through a frequency divider to control said two-phase clock.

2. The combination defined in claim 1 wherein said counter repeatedly counts to N, and the ratio of the frequencies of said high-speed clock and said two-phase clock is also equal to N.

3. The combination defined in claim 2 wherein N is equal to 360 and the output of said counter is a number giving the change in bearing in degrees.

* * * * *